United States Patent
Gauthier et al.

(10) Patent No.: US 6,691,291 B2
(45) Date of Patent: *Feb. 10, 2004

(54) METHOD AND SYSTEM FOR ESTIMATING JITTER IN A DELAY LOCKED LOOP

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/075,320

(22) Filed: Feb. 14, 2002

(65) Prior Publication Data

US 2003/0154454 A1 Aug. 14, 2003

(51) Int. Cl.[7] .................................................. G06F 17/50
(52) U.S. Cl. ................... 716/6; 716/4; 716/5; 716/18
(58) Field of Search ................ 716/1–6, 18; 703/13–15, 703/18–19

(56) References Cited

U.S. PATENT DOCUMENTS

| | | | | | |
|---|---|---|---|---|---|
| 5,600,280 | A | * | 2/1997 | Zhang | 331/57 |
| 5,818,270 | A | * | 10/1998 | Hamza | 327/116 |
| 6,037,812 | A | * | 3/2000 | Gaudet | 327/116 |
| 6,075,406 | A | * | 6/2000 | Lee et al. | 327/538 |
| 6,229,363 | B1 | * | 5/2001 | Eto et al. | 327/158 |
| 6,378,080 | B1 | * | 4/2002 | Anjo et al. | 713/500 |
| 6,380,774 | B2 | * | 4/2002 | Saeki | 327/119 |
| 6,462,623 | B1 | * | 10/2002 | Horan et al. | 331/17 |

* cited by examiner

Primary Examiner—Matthew Smith
Assistant Examiner—Paul Dinh
(74) Attorney, Agent, or Firm—Rosenthal & Osha L.L.P.

(57) ABSTRACT

A method for estimating jitter in a delay locked loop is provided. The estimation is determined from a simulation that uses a representative power supply waveform having noise as an input. Further, a computer system for estimating jitter in a delay locked loop is provided. Further, a computer-readable medium having recorded thereon instructions adapted to estimate jitter in a delay locked loop is provided.

28 Claims, 5 Drawing Sheets

METHOD AND SYSTEM FOR ESTIMATING JITTER IN A DELAY LOCKED LOOP

BACKGROUND OF INVENTION

To increase processor performance, clock frequencies used by microprocessors, often referred to as "CPUs", have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations, such as power, switching noise, and signal integrity must be taken into account.

Higher frequencies for an increased number of circuits also increase switching noise on the power supply. If the components responsible for carrying out specific operations do not receive adequate power in a timely manner, computer system performance is susceptible to degradation. The switching noise may have a local or global effect. Circuits that create large amounts of noise may be relatively isolated; however, they may also affect other circuits, possibly involving very complex interactions between the noise generation and the function of affected circuits. Thus, providing power to the components in a computer system in a sufficient and timely manner has become an issue of significant importance.

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

FIG. 1a shows a section of a typical computer system component (5). Data (8) that is 'n' bits wide is transmitted from circuit A (6) to circuit B (7). To aid in the recovery of the transmitted data, a clock composed of a clock signal (9), or CLK, is also transmitted with the data. The circuits could also have a path to transmit data from circuit B (7) to circuit A (6) along with an additional clock (not shown). The clock signal (9) may transition from one state to another at the beginning of the data transmission. Circuit B (7) requires a signal temporally located some time after the beginning of the valid data. Furthermore, the clock signal (9) may have degraded during transmission. The DLL has the ability to regenerate the clock signal (9) to a valid state and to create a phase shifted version of the clock to be used by other circuits, for example, a receiver's sampling signal. The receiver's sampling signal determines when the input to the receiver should be sampled. The performance of a DLL is critically related to the stability of its voltage supply.

FIG. 1b shows a section of a typical power supply network (10) of a computer system. The power supply network (10) may be representative of a single integrated circuit, or "chip", or equally an entire computer system comprising multiple integrated circuits. The power supply network (10) has a power supply (12) that includes a power supply line (14) and a ground line (16) through an impedance network $Z_1$ (18). Impedance networks are a collection of passive elements that result from inherent resistance, capacitance, and/or inductance of physical connections. A power supply line (22, 23) and a ground line (24, 25) facilitate power supply to a circuit A (20) and circuit B (26), respectively. Power supply line (23) and ground line (25) also supply circuit C (30) through another impedance network $Z_2$ (28) and additional impedance networks and circuits, such as impedance network $Z_n$ (22) and circuit N (34). The impedance network and connected circuits may be modeled in simulation so that the designer can better understand the behavior of how the circuits interact and interdependencies that exist.

Still referring to FIG. 1b, circuit A (20), circuit B (26), circuit C (30), and circuit N (34) may be analog or digital circuits. Also, circuit A (20), circuit B (26), circuit C (30), and circuit N (34) may generate and/or be susceptible to power supply noise. For example, circuit C (30) may generate a large amount of power supply noise that affects the operation of both circuit B (26) and circuit N (34). The designer, in optimizing the performance of circuit B (26) and circuit N (34), requires an understanding of the characteristics of the power supply noise.

SUMMARY OF INVENTION

According to one aspect of the present invention, a method for estimating jitter in a delay locked loop comprises inputting a representative power supply waveform having noise into a simulation of the delay locked loop, and estimating jitter of the delay locked loop from the simulation.

According to another aspect of the present invention, a computer system for estimating jitter in a delay locked loop comprises a processor; a memory; and software instructions stored in the memory adapted to cause the computer system to input a representative power supply waveform having noise into a simulation of the delay locked loop, and estimate jitter of the delay locked loop from the simulation.

According to another aspect of the present invention, a computer-readable medium that has recorded instructions thereon executable by a processor, where the instructions are adapted to input a representative power supply waveform having noise into a simulation of a delay locked loop, and estimate jitter of the delay locked loop from the simulation.

Other aspects and advantages of the invention will be apparent from the wing description and the appended claims.

DETAILED DESCRIPTION

Embodiments of the present invention relate to a method for estimating jitter in a delay locked loop. Embodiments of the present invention further relate to a computer system for estimating jitter in a delay locked loop. Embodiments of the present invention also relate to a program executed on a computer for estimating jitter in a delay locked loop.

Figure 1A:
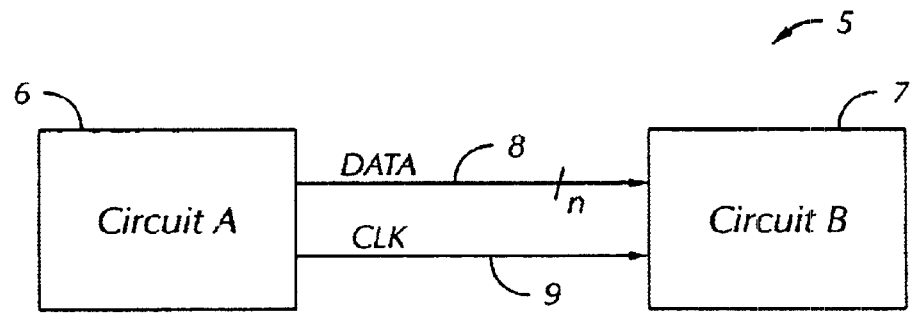
FIG. 1a shows a typical computer system component.
Figure 1B:
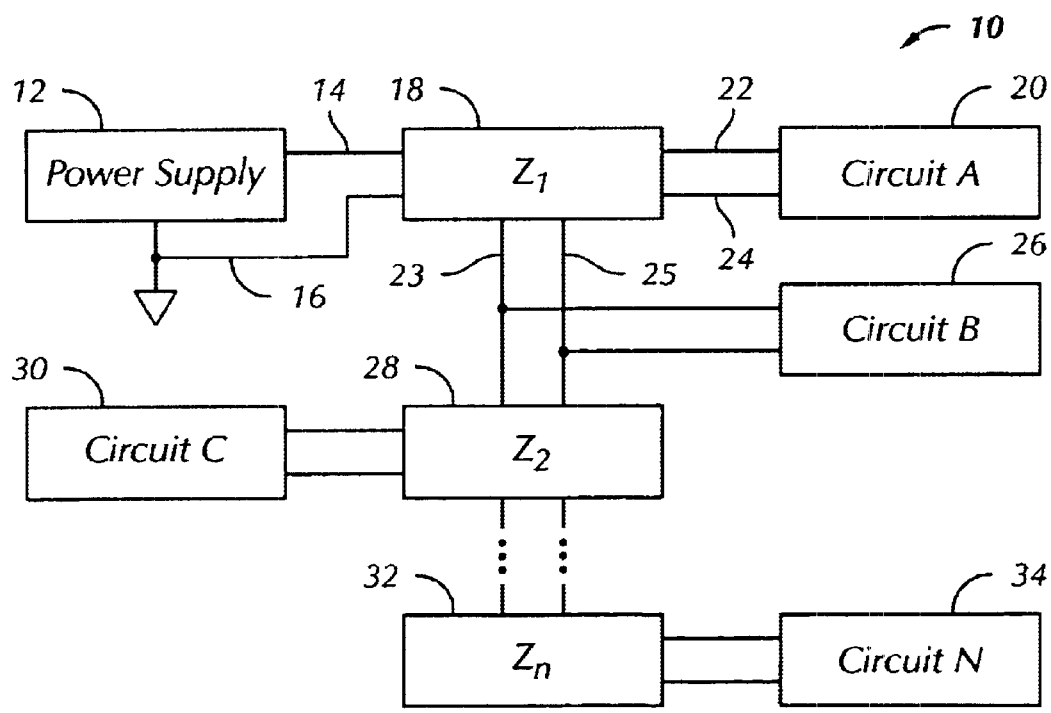
FIG. 1b shows a typical computer system power supply network.

In FIG. 1b, the impedance networks (18, 28, 32) may be very complex arrangements of passive elements. The impedances may be the result of, but not limited to, a power supply connection, bulk capacitors, printed circuit board planes, printed circuit board vias, ceramic capacitors, printed circuit board to chip package connections, chip package planes, chip package vias, chip package capacitors, chip package to chip bump or bond wire connections, chip local and global decoupling capacitors, and switching and non-switching circuit elements. A "chip package" for the purpose of this description of the invention may be any package that allows mounting an integrated circuit to a printed circuit board. An integrated circuit, or die, is also referred to as a "chip" in this description. Also, each of the circuits (20, 26, 30, 34) in FIG. 1b may induce power supply noise on the impedance networks (18, 28, 32). The power supply noise characteristics can result from very complex interactions between the circuits (20, 26, 30, 34) coupled with the impedance networks (18, 28, 32).

For a designer to adequately examine the behavior of the power supply noise, a simulation model is desirable. The simulation model is input into a simulation tool so that a computer can calculate the effects of one or more input excitations. One example of a simulation tool is SPICE. Modeling a complex array of impedances is difficult, however. Furthermore, even if an accurate simulation model is created, the computing overhead necessary to simulate a circuit or circuits with the impedance model network may be too great.

Figure 2A:
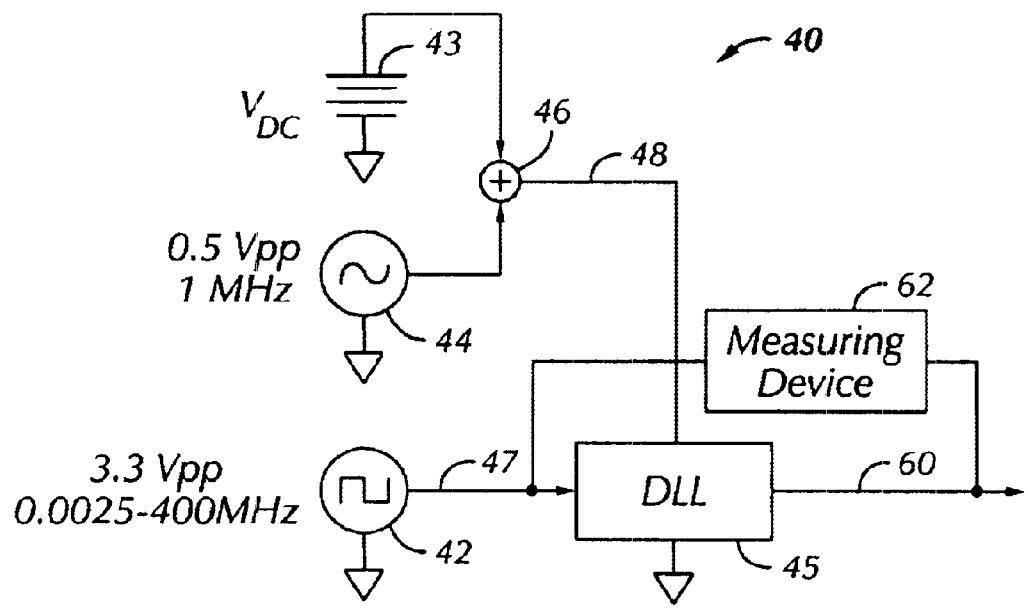
FIG. 2a shows a DLL circuit test arrangement.

In the absence of an accurate model, nominal case and worst case simulations are often used. In FIG. 2a, a test arrangement (40) for a delay locked loop (DLL) is shown. The DLL (45) is supplied by a DC power supply (43). The DLL (45) has, in this example, a clock input (42) comprising a square wave between 0 V and 3.3 V at a frequency that can be varied between 2.5 kHz and 400 MHz on signal line (47). To model the power supply noise, a sine wave generator (44) supplies a 0.5 V peak-to-peak signal that is added to the DC power supply (43) at adder (46). The combined DC power supply (43) and sine wave generator (44) output is supplied on power supply line (48) to the DLL (45). The frequencies and voltages of the DC power supply (43), sine wave generator (44), and clock input (42) may be changed to model different operating points or extreme conditions. A sine wave approximates the power supply noise, but the actual noise characteristics may be much more complex.

In simulating the DLL, jitter is a common performance measure. Jitter is the time domain error from poor spectral purity of an output. In other words, in a repeated output pattern, a transition from one state to another does not happen at the same time relative to other transitions. A measuring device (62) measures the variations between the clock input (42) and the DLL output (60). Ideally, the delay between the clock input (42) and the DLL output (60) should be constant; however, power supply noise creates jitter.

Figure 2B:
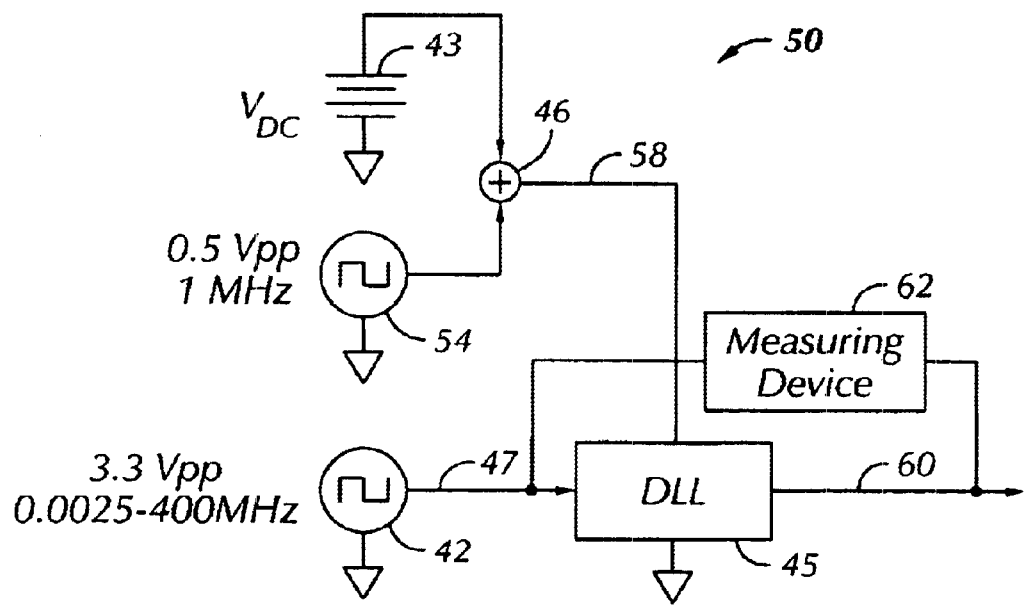
FIG. 2b shows another DLL circuit test arrangement.

In FIG. 2b, another test arrangement (50) for a DLL is shown. The DLL (45) is supplied by a DC power supply (43). The DLL (45) has, in this example, a clock input (42) that comprises a square wave between 0 V and 3.3 V at a frequency that can be varied between 2.5 kHz and 400 MHz on signal line (47). To model the power supply noise, a square wave generator (54) supplies a 0.5 V peak-to-peak signal that is added to the DC power supply (43) at adder (46). The combined DC power supply (43) and square wave generator (54) output is supplied on power supply line (58) to the DLL (45). The power supply waveform having noise on power supply line (58) creates jitter on DLL output (60). Temporal shifts and rate of occurrence of the temporal shifts between the clock input (42) and the DLL output (60) are measured by the measuring device (62). The frequencies and voltages of the DC power supply (43), square wave generator (54), and clock input (42) may be changed to model different operating points or extreme conditions.

In both FIG. 2a and FIG. 2b, the noise generated by the sine wave generator (44) and square wave generator (54) may not be representative of typical power supply noise in a real system. In fact, the square wave generator (44) may generate noise that exceeds typical power supply noise. Adding additional circuitry to the DLL (45) may not be needed in the actual design to meet the desired specifications.

Figure 3B:
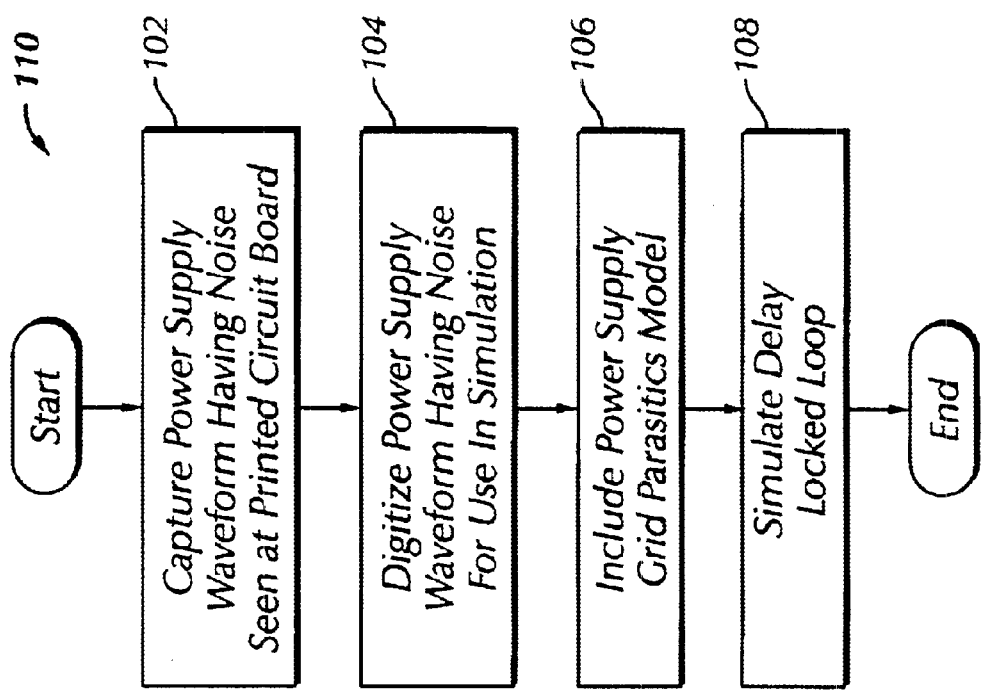
FIG. 3b shows a flow process in accordance with another embodiment of the present invention.
Figure 3A:
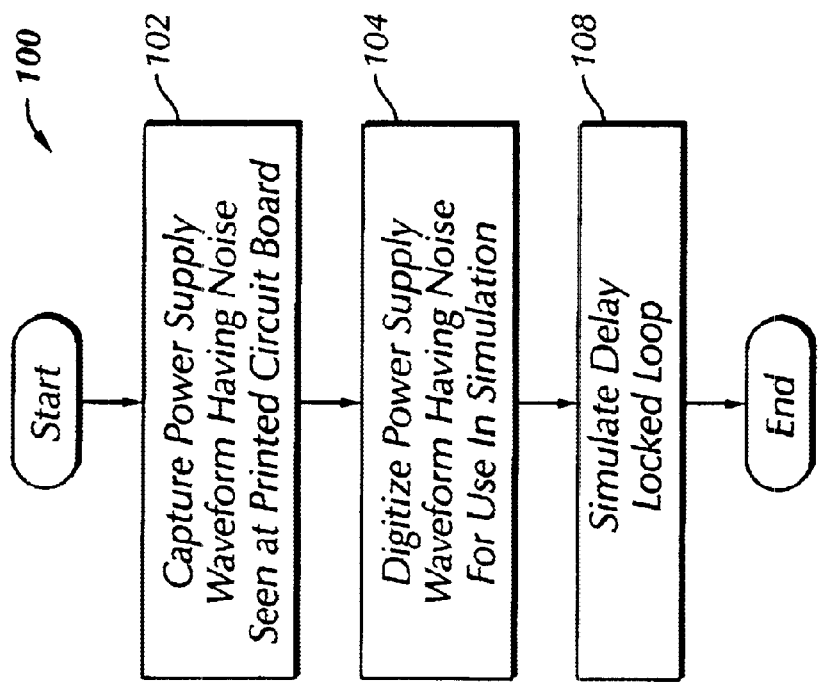
FIG. 3a shows a flow process in accordance with an embodiment of the present invention.

FIG. 3a shows an exemplary flow process (100) in accordance with an embodiment of the present invention. At (102), a power supply waveform having noise is captured. A power supply waveform having noise for the purpose of this description may be any power supply that has deviations from a designed voltage. This power supply waveform is captured at some particular location within a power supply network. Those skilled in the art will appreciate that the noise in the captured power supply waveform comes from a dominant source of noise. A circuit under design does not provide a substantial contribution to the noise in the captured power supply waveform. The power supply waveform having noise may be used to adequately represent a large portion of the power supply network and associated circuitry.

In FIG. 1b, for example, circuit C (30) may be the dominant source of noise. The DLL under design may be circuit N (34). By capturing a power supply waveform having noise between impedance networks $Z_2$ (28) and $Z_n$ (32), a system response that represents a large portion of the power supply network and associated circuitry is used. For example, the power supply network and associated circuitry may include the power supply (12), impedance network $Z_1$ (18), circuit A (20), circuit B (26), circuit C (30), and impedance network $Z_2$ (28). Because the dominant source (circuit C (30)) is included in the power supply network and associated circuitry, a simulation using the power supply waveform having noise, impedance network $Z_n$ (32) and circuit N (34) is sufficient.

With regard to simulating a CPU circuit, capturing a power supply waveform on a printed circuit board near the CPU is desirable. The captured power supply waveform will also contain noise as a result of activities on the printed circuit board by one or more circuits. The captured power supply waveform may be the result of physically measuring the voltage on the printed circuit board under operating conditions with measuring equipment. These operating conditions may include extreme conditions in an effort to capture a worst case power supply waveform having noise. These operating conditions may be the result of varying one or more of the following: temperature, voltage, frequency, and manufacturing process. The captured power supply waveform may also be the result of a simulation of some portion of the power supply network. For the purposes of this description of the invention, a representative power supply waveform comprises an approximation of an actual power supply waveform as occurs in a realistic system. By capturing the power supply waveform at an intermediate point in the power supply network, a division in design responsibilities and expertise is achieved. A power supply network designer may focus on design and simulation of a portion of the power supply network while a circuit designer may capture representative power supply signals at an appropriate location to be used as an input to their circuits.

The captured power supply waveform is digitized at (104) to be input to a simulation program. The digitization may be a direct point by point representation. The digitization may also be a representative model of the waveform that may include a formulated representation in which an equation characterizes the power supply waveform having noise. At (108), the DLL under design is simulated using the digitized power supply waveform having noise captured from the printed circuit board at (104). At (108), the computational overhead of the simulation is reduced due to the input of the power supply waveform having noise being used instead of a portion of the power supply network that may contain a large number of elements. Also, the simulation of the DLL at (108) is more accurate because the digitized power supply waveform having noise is used instead of a sine or square wave.

In FIG. 3b, an exemplary flow process (110) in accordance with another embodiment of the present invention is shown. At (102), a power supply waveform having noise, as described previously, is captured. The captured power supply waveform is digitized at (104), as described previously, to be input to a simulation program. Capturing and digitizing the power supply waveform does not preclude the addition of circuits to model another portion of the power supply network not represented in the captured and digitized power supply waveform. This additional portion of the power supply network may be used between the captured power supply waveform and the circuit under design. At (106), elements may be added to the simulation to represent additional power supply network components. For example, a captured power supply signal may be captured on a printed circuit board; however, the circuit to be designed resides on an integrated circuit. At (106), the power supply network elements that may be added include, but are not limited to, connections (parasitics) between the printed circuit board and chip package, connections (parasitics) between the chip package and chip, and connections (parasitics) between the chip power supply network and circuit under design. These added elements may improve the modeling of the actual passive parasitics. At (108), the DLL under design is simulated using the digitized power supply waveform having noise captured from the printed circuit board at (104) and the parasitics from (106). At (108), the computational overhead of the simulation is reduced due to the input of the power supply waveform having noise being used instead of a portion of the power supply network that may contain a large number of elements. Also, the simulation of the DLL at (108) is more accurate because the digitized power supply waveform having noise is used instead of a sine or square wave.

Those skilled in the art will appreciate that the captured power supply waveform having noise may be obtained from probing a physical system, such as a printed circuit board, chip package, or chip, under various operating conditions. Operating conditions include, but are not limited to, temperature, voltage, frequency, and manufacturing (process) variations. Those skilled in the art will also appreciate that the captured power supply waveform having noise may be obtained from probing an integrated circuit under various operating conditions. Furthermore, those skilled in the art will appreciate that the power supply waveform having noise obtained from a physical system may be obtained from a location adjacent to an intended location of the DLL under various operating conditions. Those skilled in the art will further appreciate that using the power supply waveform having noise in place of a portion of the power supply network reduces the computational load when simulating the circuit.

Those skilled in the art will appreciate that the captured power supply signal having noise may be obtained from simulation data of a modeled printed circuit board's parasitics under various operating conditions. Furthermore, those skilled in the art will appreciate that the captured power supply waveform having noise may be obtained from simulation data of a power supply network's parasitics that may include, but is not limited to, the motherboard power supply network, motherboard to integrated circuit connections, and/or integrated circuit power supply network under various operating conditions. Operating conditions include, but are not limited to, temperature, voltage, frequency, and manufacturing (process) variations. Those skilled in the art will further appreciate that the simulation of the circuit using the power supply waveform having noise may be dependent on various operating conditions. Those skilled in the art will also appreciate that the simulation tool used to simulate the power supply waveform having noise does not have to be the same simulation tool used to simulate the circuit using the power supply waveform having noise.

Those skilled in the art will appreciate that capturing the power supply signal having noise, whether from a physical system or simulation, may advantageously be obtained adjacent to an intended location of the DLL.

Those skilled in the art will appreciate that the noise may be captured separately from the power supply waveform and combined to create the power supply waveform having noise.

Those skilled in the art will appreciate that multiple power supply waveforms having noise may be used simultaneously, and the multiple power supply waveforms having noise may be connected to different locations on the power supply network. Those skilled in the art will further appreciate that the DLL and additional circuits may be used in the simulation at (108).

Those skilled in the art will appreciate that the DLL may be analog, digital, or a combination of both types of circuits.

Figure 4:
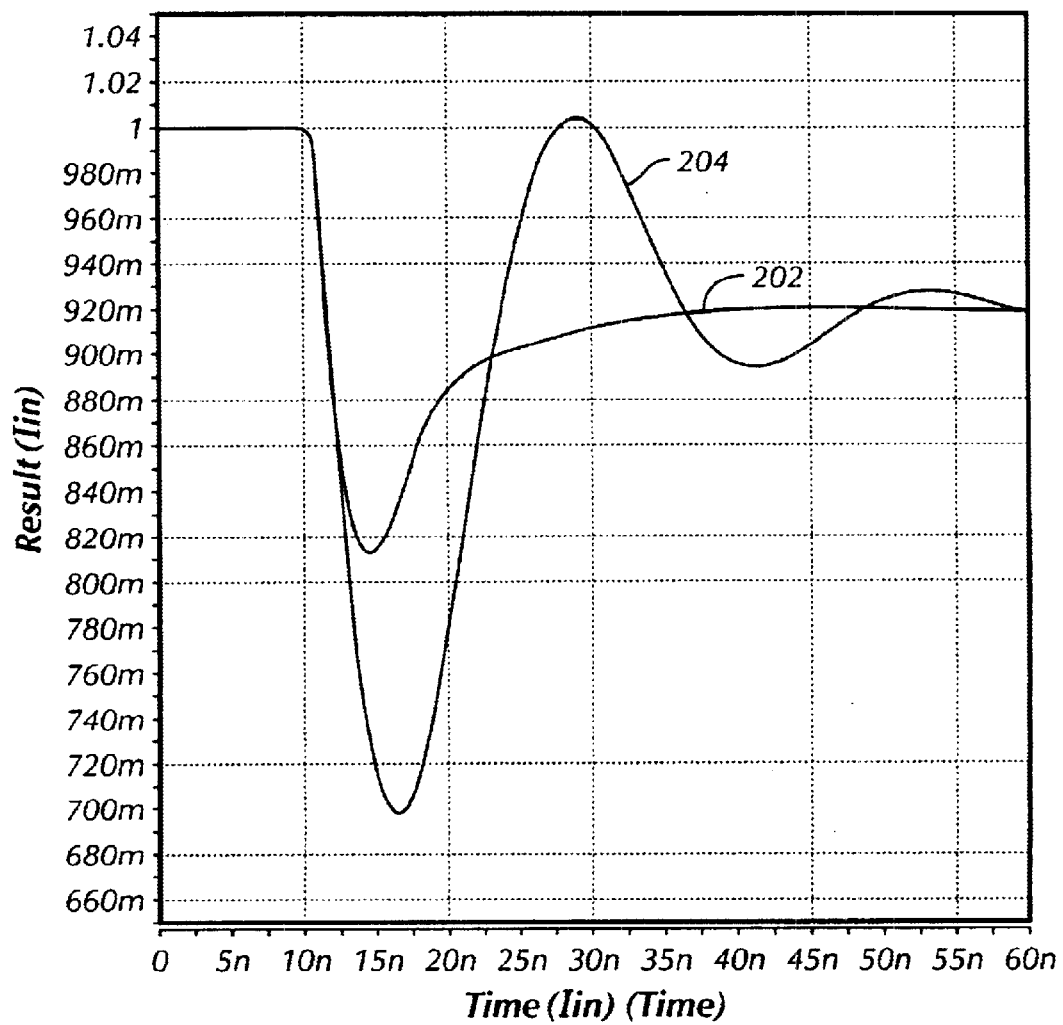
FIG. 4 shows captured power supply waveforms in accordance with another embodiment of the present invention.

In FIG. 4, two captured power supply waveforms having noise (202, 204), in accordance with various embodiments of the present invention, are shown. Both captured power supply waveforms start at time zero at approximately 1 V. At 10 ns, one or more circuits interacting with one or more impedance networks create noise on the power supply waveforms. For power supply waveform (202), the effect is reduced compared to power supply waveform (204). Power supply waveforms having noise (202, 204) are generated using two different configurations of the power supply network. The reduced noise on power supply waveform (202) may be the result of a more costly configuration. The function of the DLL may be simulated using power supply waveform (204). If the function of the DLL at least meets the specification, the power supply network using a less costly configuration may be used.

Those skilled in the art will appreciate that power supply waveform (202) and power supply waveform (204) may have been captured under different operating conditions.

Those skilled in the art will further appreciate that power supply waveform (202) and power supply waveform (204) may have been captured at different locations within the power supply network.

Figure 5:
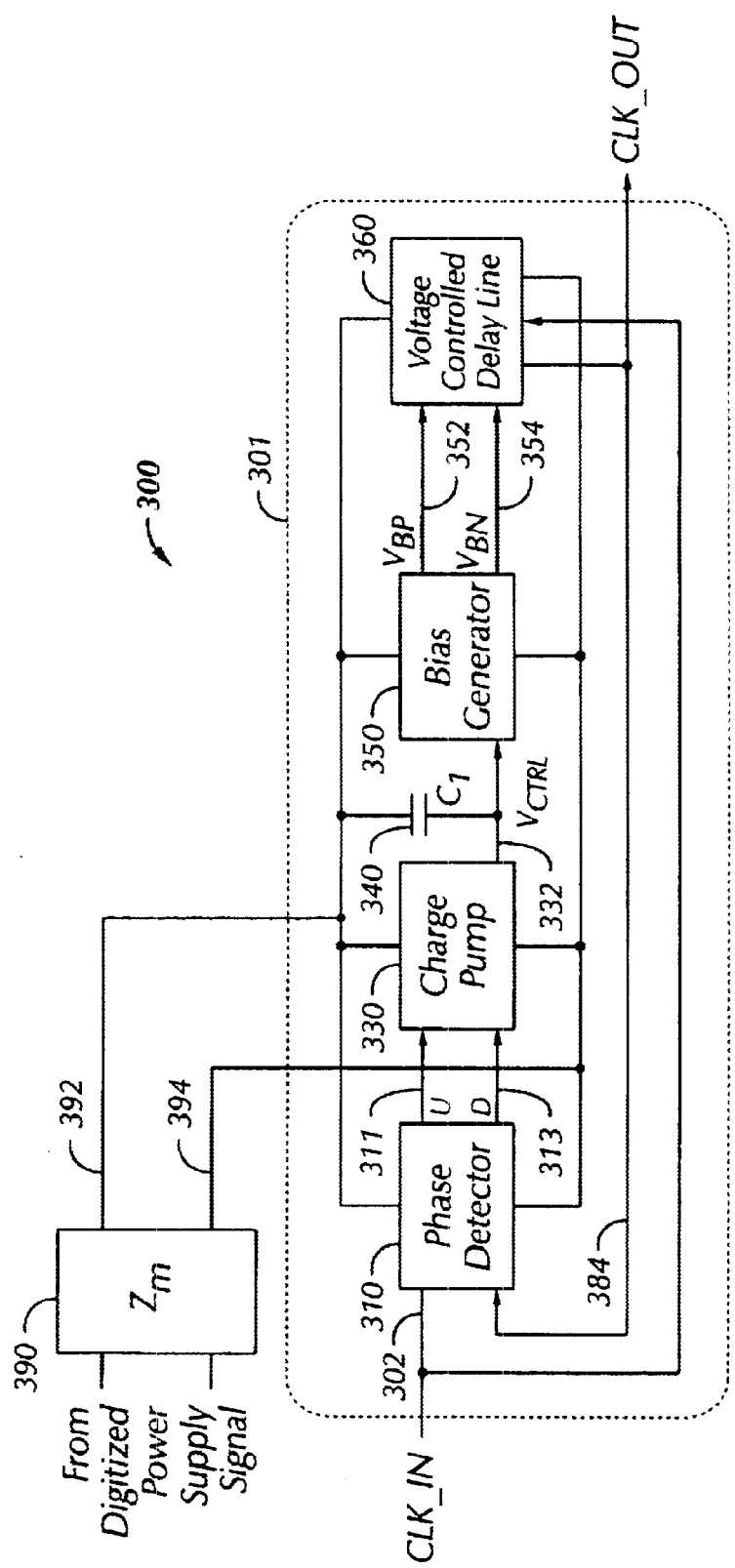
FIG. 5 shows a circuit in accordance with another embodiment of the present invention.

FIG. 5 shows an exemplary circuit (300) in accordance with another embodiment of the present invention. A block diagram drawing of a DLL (301) is shown. The DLL (301) has an input of CLK_IN (302) that is used to create a phased output. CLK_IN (302) is used as an input to a voltage controlled delay line (360) and to a phase detector (310). The phase detector (310) measures whether the phase difference between CLK_IN (302) and an output (384) of the delay path is correct. An adjustment in the phase delay produces signals that control a charge pump, typically up (U) (311) or down (D) (313) pulses. The charge pump (330) adds or removes charge from a loop filter, shown as a bias generator (350), changing the DC value at the input of the bias generator (350). A DC value input to the biased generator (350) is the control voltage, $V_{CTRL}$ (332). The charge pump (330) adjusts the voltage stored on a capacitor C1 (340) between $V_{CTRL}$ (332) and a potential. The bias generator (350) produces the signals $V_{BP}$ (352) and $V_{BN}$ (354) that control the delay of the voltage controlled delay line (360). The voltage controlled delay line (360) may be implemented using current starved elements. This means that the delays are controlled by modifying the amount of current available for charging and discharging capacitances. The linearity of a voltage controlled delayed line's characteristics determines the stable range of frequencies over which the delayed lock loop can operate. The output (384) from the voltage controlled delay line (360) provides a phase delayed clock CLK_OUT to other circuits.

Still referring to FIG. 5, a power supply waveform having noise has been determined from a power supply network and digitized. The power supply waveform having noise is operatively used either through direct digitization or appropriate modeling such as a formulated representation where an equation describes the signal's characteristics. The power supply waveform having noise is input to an impedance network $Z_M$ (390). The impedance network $Z_M$ (390) supplies power to the DLL (301) through power supply line (392) and ground line (394). Simulating the DLL (301) with the representation of the power supply waveform having noise provides a technique to estimate jitter.

Jitter represents the perturbations that result in the intermittent shortening or lengthening of signal elements. For example, a steady clock input may be used as an input of CLK_IN (302) to the DLL (301). A piece-wise linear representation of the power supply waveform having noise ((202) (in FIG. 4)) may be used to supply the impedance network $Z_M$ (390). The power supply waveform having noise (202) may be acquired from a simulation of a printed circuit board from a dominant power supply noise source. The impedance network $Z_M$ (390) represents additional impedances between the printed circuit board and the DLL (301) that is located on an integrated circuit. The power supply waveform having noise may disturb the output (384) from the voltage controlled delay line (360). Variations between the transition from one state to another state between the input of CLK_IN (302) to the DLL (301) and the output (384) from the voltage controlled delay line (360) represent jitter. Because a realistic power supply waveform having noise is used, the DLL will not be over designed with respect to control of jitter. Also, the simulation can be completed in a reasonable amount of time; therefore, the DLL design and/or the chip parasitics may be modified in an iterative fashion to improve the system's performance.

Those skilled in the art will appreciate that a computer system is described for determining a representation of a power supply waveform having noise, using that representation to simulate a delay locked loop, and estimating jitter in the delay locked loop.

Those skilled in the art will appreciate that a computer-readable medium having recorded thereon instructions executable by a processor is described to determine a representation of a power supply waveform having noise, using that representation to simulate a delay locked loop, and estimating jitter in the delay locked loop.

Advantages of the present invention may include one or more of the following. In some embodiments, because a representation of a power supply signal having noise is used, a more accurate circuit simulation may be performed. Realistic results help alleviate costly over design. A circuit designed with more accurate power supply waveforms may result in reduced chip area. The space saved due to the reduced chip area may be used for additional performance enhancing circuits, or may be used to reduce the final chip size, hence cost.

In some embodiments, because a representation of a power supply signal having noise is used, a circuit simulation that requires less computational load may be performed. Accordingly, more iterations in the design process may be afforded.

In some embodiments, because a representation of a power supply signal having noise is used, tasks involved with designing a power supply network and individual circuits may be advantageously divided and performed by experts in their respective areas of expertise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for estimating jitter in a delay locked loop, comprising:

inputting a representative power supply waveform having noise into a simulation of the delay locked loop; and estimating jitter of the delay locked loop from the simulation, wherein the representative power supply waveform is obtained from a physical system.

2. The method of claim 1, wherein the physical system comprises a printed circuit board.

3. The method of claim 1, wherein the physical system comprises a chip package.

4. The method of claim 1, wherein the physical system comprises a chip.

5. The method of claim 2, wherein the representative power supply waveform is obtained from a location on a physical system adjacent to an intended location of the delay locked loop.

6. The method of claim 1, wherein the representative power supply waveform is dependent on at least one operating condition selected from the group consisting of temperature, voltage, frequency, and manufacturing process.

7. The method of claim 1, wherein the simulation of the delay locked loop is dependent on at least one operating condition selected from the group consisting of temperature, voltage, frequency, and manufacturing process.

8. A method for estimating jitter in a delay locked loop, comprising:

inputting a representative power supply waveform having noise into a simulation of the delay locked loop; and estimating jitter of the delay locked loop from the simulation, wherein the representative power supply waveform is obtained from a simulation of a power supply, and wherein the simulation of the power supply is performed using a first simulation tool and the simulation of the delay locked loop is performed using a second simulation tool.

9. A computer system for estimating jitter in a delay locked loop, comprising:

a processor;

a memory; and software instructions stored in the memory adapted to cause the computer system to:
input a representative power supply waveform having noise into a simulation of the delay locked loop; and
estimate jitter of the delay locked loop from the simulation.

10. The computer system of claim 9, wherein the representative power supply waveform is obtained from a physical system.

11. The computer system of claim 10, wherein the physical system comprises a printed circuit board.

12. The computer system of claim 10, wherein the physical system comprises a chip package.

13. The computer system of claim 10, wherein the physical system comprises a chip.

14. The computer system of claim 9, wherein the representative power supply waveform is obtained from a location on a physical system adjacent to an intended location of the delay locked loop.

15. The computer system of claim 9, wherein the representative power supply waveform is obtained from a simulation of a power supply.

16. The computer system of claim 15, wherein the simulation of the power supply is performed using a first simulation tool and the simulation of the delay locked loop is performed using a second simulation tool.

17. The computer system of claim 9, wherein the representative power supply waveform comprises a noise waveform combined with a power supply waveform.

18. The computer system of claim 9 wherein the representative power supply waveform is dependent on at least one variable condition selected from the group consisting of temperature, voltage, frequency, and manufacturing process.

19. The computer system of claim 9, wherein the simulation of the delay locked loop is dependent on at least one variable condition selected from the group consisting of temperature, voltage, frequency, and manufacturing process.

20. A computer-readable medium having recorded thereon instructions executable by a processor, the instructions adapted to:
input a representative power supply waveform having noise into a simulation of a delay locked loop; and
estimate jitter of the delay locked loop from the simulation,
wherein the representative power supply waveform is obtained from a physical system.

21. The computer-readable medium of claim 20, wherein the physical system comprises a printed circuit board.

22. The computer-readable medium of claim 20, wherein the physical system comprises a chip package.

23. The computer-readable medium of claim 20, wherein the physical system comprises a chip.

24. The computer-readable medium of claim 20, wherein the representative power supply waveform is obtained from a location on a physical system adjacent to an intended location of the delay locked loop.

25. The computer-readable medium of claim 20, wherein the representative power supply waveform comprises a noise waveform combined with a power supply waveform.

26. The computer-readable medium of claim 20, wherein the representative power supply waveform is dependent on at least one operating condition selected from the group consisting of temperature, voltage, frequency, and manufacturing process.

27. The computer-readable medium of claim 20, wherein the simulation of the delay locked loop is dependent on at least one operating condition selected from the group consisting of temperature, voltage, frequency, and manufacturing process.

28. A computer-readable medium having recorded thereon instructions executable by a processor, the instructions adapted to:
input a representative power supply waveform having noise into a simulation of a delay locked loop; and
estimate jitter of the delay locked loop from the simulation,
wherein the representative power supply waveform is obtained from a simulation of a power supply, and
wherein the simulation of the power supply is performed using a first simulation tool and the simulation of the delay locked loop is performed using a second simulation tool.

* * * * *

UNITED STATES PATENT AND TRADEMARK OFFICE
CERTIFICATE OF CORRECTION

PATENT NO. : 6,691,291 B2
DATED : February 10, 2004
INVENTOR(S) : Claude Gauthier et al.

It is certified that error appears in the above-identified patent and that said Letters Patent is hereby corrected as shown below:

Column 8,
Line 54, replace "2" with -- 1 --.

Signed and Sealed this

Eighteenth Day of May, 2004

JON W. DUDAS
*Acting Director of the United States Patent and Trademark Office*